United States Patent [19]
Rasmussen

[11] Patent Number: 5,905,412
[45] Date of Patent: May 18, 1999

[54] PROCESS COMPENSATION METHOD FOR CMOS CURRENT CONTROLLED RING OSCILLATORS

[75] Inventor: Richard R. Rasmussen, Fremont, Calif.

[73] Assignee: National Semiconductor Corporation, Santa Clara, Calif.

[21] Appl. No.: 08/861,268

[22] Filed: May 21, 1997

[51] Int. Cl.[6] .............................. H03B 5/24; H03B 5/04; H03L 1/00; H03L 7/099

[52] U.S. Cl. ............................ 331/57; 331/34; 331/175; 331/177 R; 331/185; 327/288

[58] Field of Search ....................... 331/34, 57, 116 FE, 331/143, 175, 176, 177 R, 185, 186; 327/103, 281, 288, 543

[56] References Cited

U.S. PATENT DOCUMENTS 5,061,907  10/1991  Rasmussen ............................... 331/57
5,068,553  11/1991  Love ............................. 327/288 X
5,331,295   7/1994  Jelinek et al. ........................... 331/57

*Primary Examiner*—David Mis
*Attorney, Agent, or Firm*—Eugene Conser

[57] ABSTRACT

A current controlled oscillator circuit comprising a "variable-ratio current mirror", for providing a variable output current that varies in response to process. The "variable-ratio current mirror" having a reference MOS transistor and a mirrored MOS transistor, and the reference MOS transistor has a greater predetermined channel length than the channel length of the mirrored MOS transistor. A second current mirror is coupled to the "variable-ratio current mirror" to provide a control current that decreases in response to an increase in the variable output current of the "variable-ratio current mirror." A multi-stage ring oscillator having a plurality of series-connected inverter stages is responsive to the control current of said second current mirror for controlling the frequency of oscillation of said multi-stage ring oscillator.

8 Claims, 4 Drawing Sheets

PROCESS COMPENSATION METHOD FOR CMOS CURRENT CONTROLLED RING OSCILLATORS

BACKGROUND OF THE INVENTION

The invention relates to a CMOS current controlled ring oscillator (VCO) and particularly to a method and system for obtaining a well-controlled output range over varying process.

The VCO is an oscillator whose frequency is proportional to an externally applied voltage. VCO's are commonly used in phase-locked loop (PLL) designs. A block diagram of a basic PLL system is shown in FIG. 1. The elements of the system are a phase detector (12), a loop filter (14), and a VCO (16) interconnected to form a feedback system. The phase detector compares the phase of the input signal Vs(t) with the output frequency Vo(t) of the VCO and generates an error voltage Vd(t) corresponding to the difference. The error voltage signal Vd(t) is then filtered by the loop filter and applied to the control terminal of the VCO in the form of an error voltage Ve(t) to control its frequency of oscillation.

A problem that has plagued VCO designs in the past has been that of maintaining a constant VCO Ve(t) error voltage characteristic over the wide process variations that are inherent in the CMOS devices (i.e. changes in the manufacturing process, such as changes in doping levels and lithography variations). Process variations can cause a huge shift in the gain of a delay element that forms the ring oscillator. This in turn changes the gain constant, tuning slope, and the frequency (FIG. 2). Good PLL designs require a knowledge and control of several loop parameters—one of which is the VCO gain. Thus, the VCO circuit needs to be de-sensitized to the process variations so that the PLL dynamics are not disturbed.

A patent assigned to National Semiconductor Corporation and issued to Rasmussen, U.S. Pat. No. 5,061,907 discloses a VCO that includes a multistage ring oscillator, a voltage-to-current converter, process compensation circuitry, and a trip-point compensation circuit. This VCO achieves immunity from process variations by the use of the process compensation circuitry and the trip-point compensation circuitry. The process compensation circuitry in Rasmussen responds to the error voltage input signal to provide a current dump output signal that is dependent on transistor strength, i.e., dependent on process variation. The trip-point compensation circuit in Rasmussen generates a net current created by subtracting the process compensation current from the current generated by the voltage-to-current converter, and then steers a variable percentage of that net current to the ring oscillator in accordance with the strength of the N- and P-channel transistors in the device.

The output currents from both the voltage-to-current converter and the process compensation circuitry in Rasmussen are dependent on the error voltage input signal and the relative strengths of the N and P channel devices. However, under certain conditions where the N and P channel devices are particularly strong and the error voltage is at a particularly high level, an inappropriate current dump output signal can exist. This condition exists when the process compensation current (current dump) becomes too high and thereby too much current is starved from the ring oscillator via the trip point compensation circuitry. The present invention avoids this inappropriate current dump output signal condition by never allowing the ring oscillator current level to become too low.

Another drawback to Rasmussen is that the process compensation current (current dump) will vary with VCC supply voltage. Thus, changes in VCC supply voltage may cause the current dump to become too low or too high. The present invention avoids this dependency on the VCC supply voltage by using only the error voltage and process strength to establish the proper current levels.

A patent assigned to National Semiconductor Corporation and issued to Jelinek et al., U.S. Pat. No. 5,331,295 discloses a VCO that includes a multistage ring oscillator that includes a plurality of series-connected current-starved inverter stages. The VCO utilizes a first current source to provide a substantially constant current independent of process variations and a second current source to provide a variable current that varies in response to process variations. An attenuator, responsive to the VCO's input voltage signal (typically from a phase-locked loop filter) provides a control current signal to the ring oscillator. The attenuator receives a supply current created by subtracting the second current from the first current, and utilizes a differentiation subcircuit that attenuates the supply current in response to changes in an input voltage to produce a current control signal that sets the current level in the ring oscillator's cells. The frequency of oscillation of the ring oscillator is determined by the control current signal.

A drawback to Jelinek is the requirement of the first current source to provide an accurate current that is independent of process variations. This first current source requires the use of complex circuitry and accurate resistor elements which increases the size and power consumption of the overall circuit. The present invention avoids the use of such a large and complicated current source.

SUMMARY OF THE INVENTION

In summary, the present invention is a VCO where process variations have minimal effect on output frequency. The VCO includes a multistage ring oscillator that has a plurality of series-connected current-controlled inverter stages.

To compensate for process variations, the present invention uses a "variable-ratio current mirror." The "variable-ratio current mirror" is used to provide a process compensation current that is subtracted from the current provided by a second current source to form a resultant control current that is used to control the frequency of the ring oscillator. The object of the "variable-ratio current mirror" is to have a stronger transference of current when the process is fast (strong), and a lower transference of current when the process is slow (weak). To prevent the condition where the process compensation current becomes too high, the ratio of the "variable-ratio current mirror" is not allowed to exceed a pre-determined limit.

DESCRIPTION OF THE PREFERRED EMBODIMENT

Figure 1:
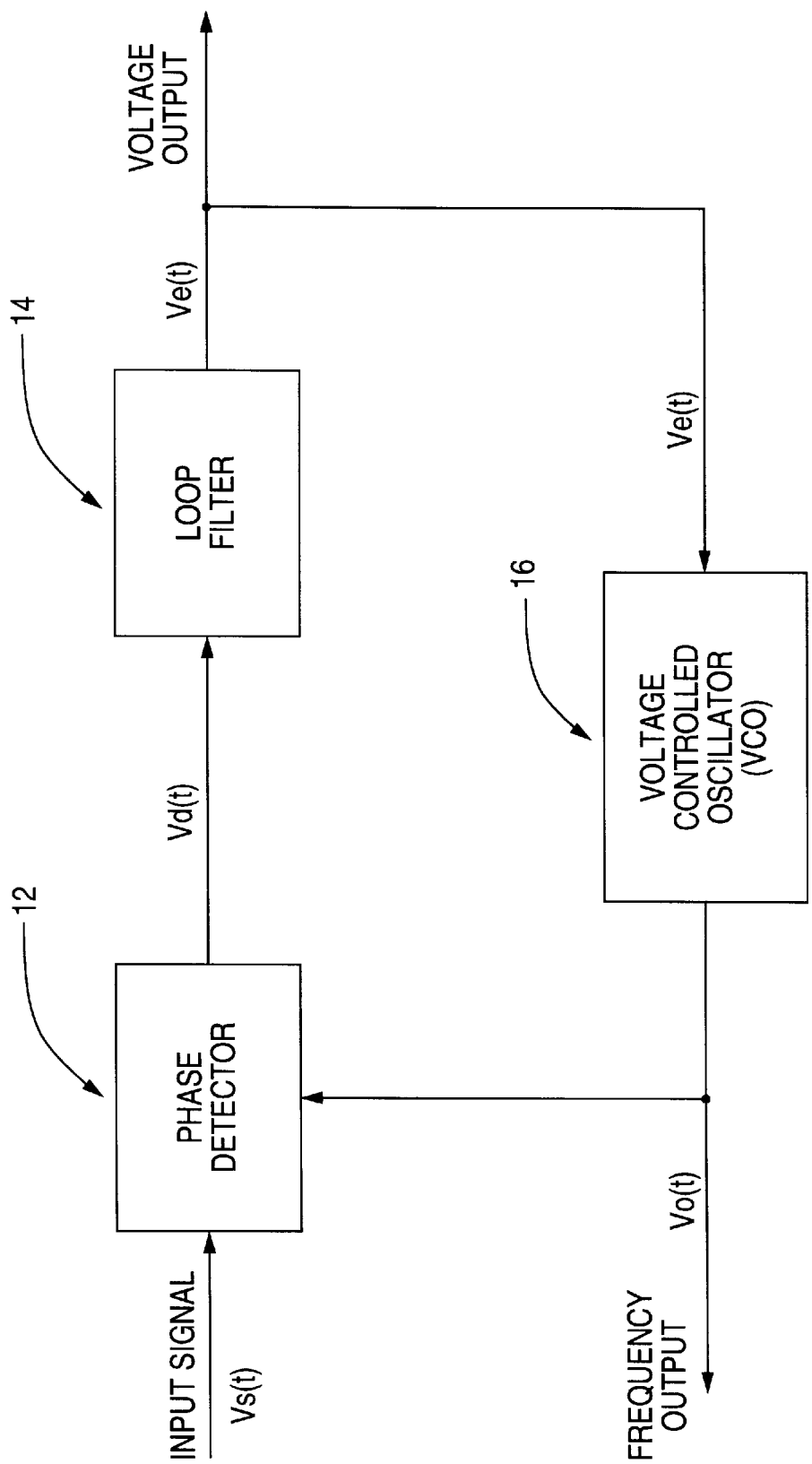
FIG. 1 is a block diagram of a basic phase-locked loop (PLL) system.
Figure 2:
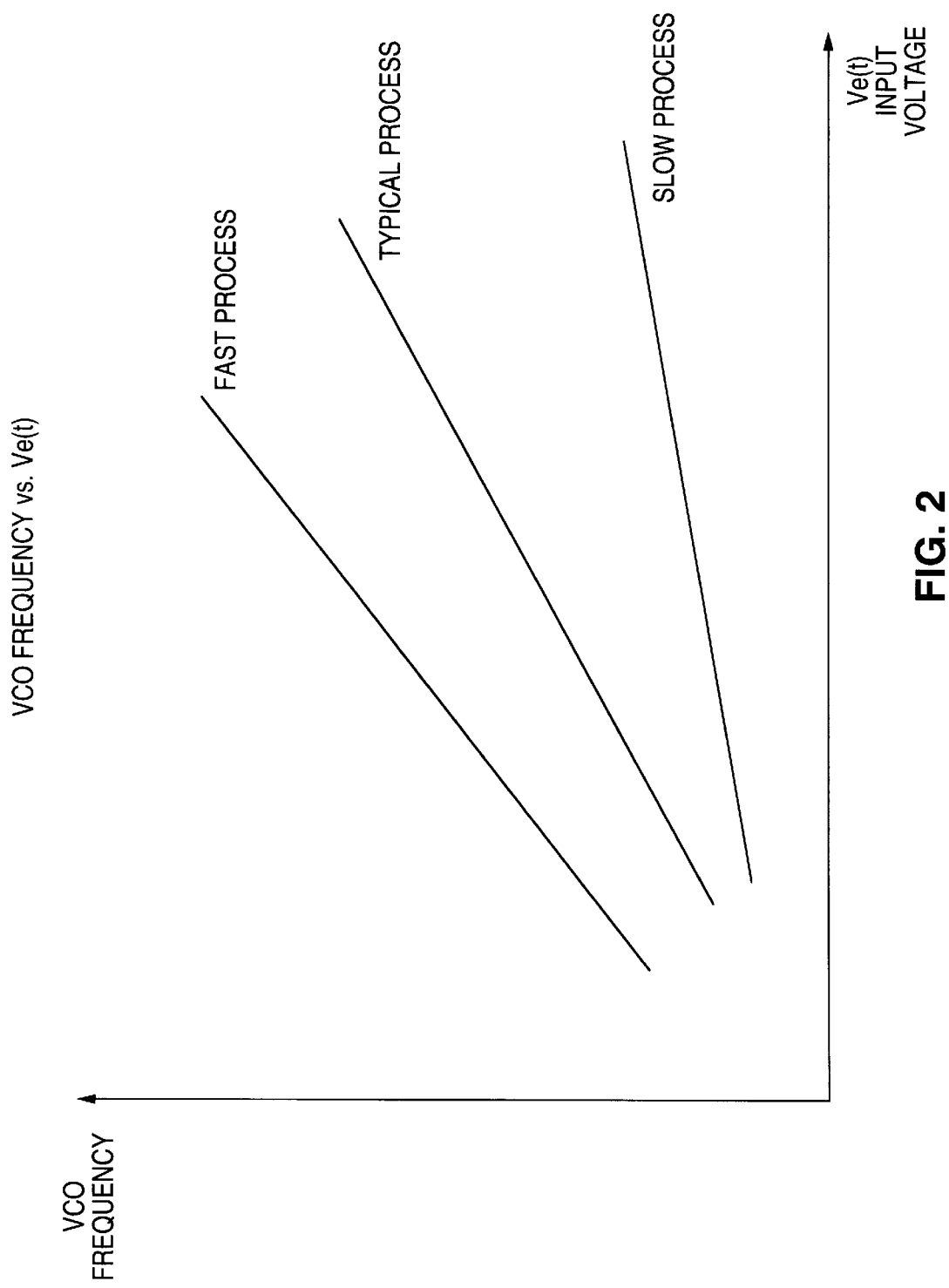
FIG. 2 is a plot of VCO frequency vs. Ve(t) error voltage in relation to fast, typical, and slow processes.
Figure 3:
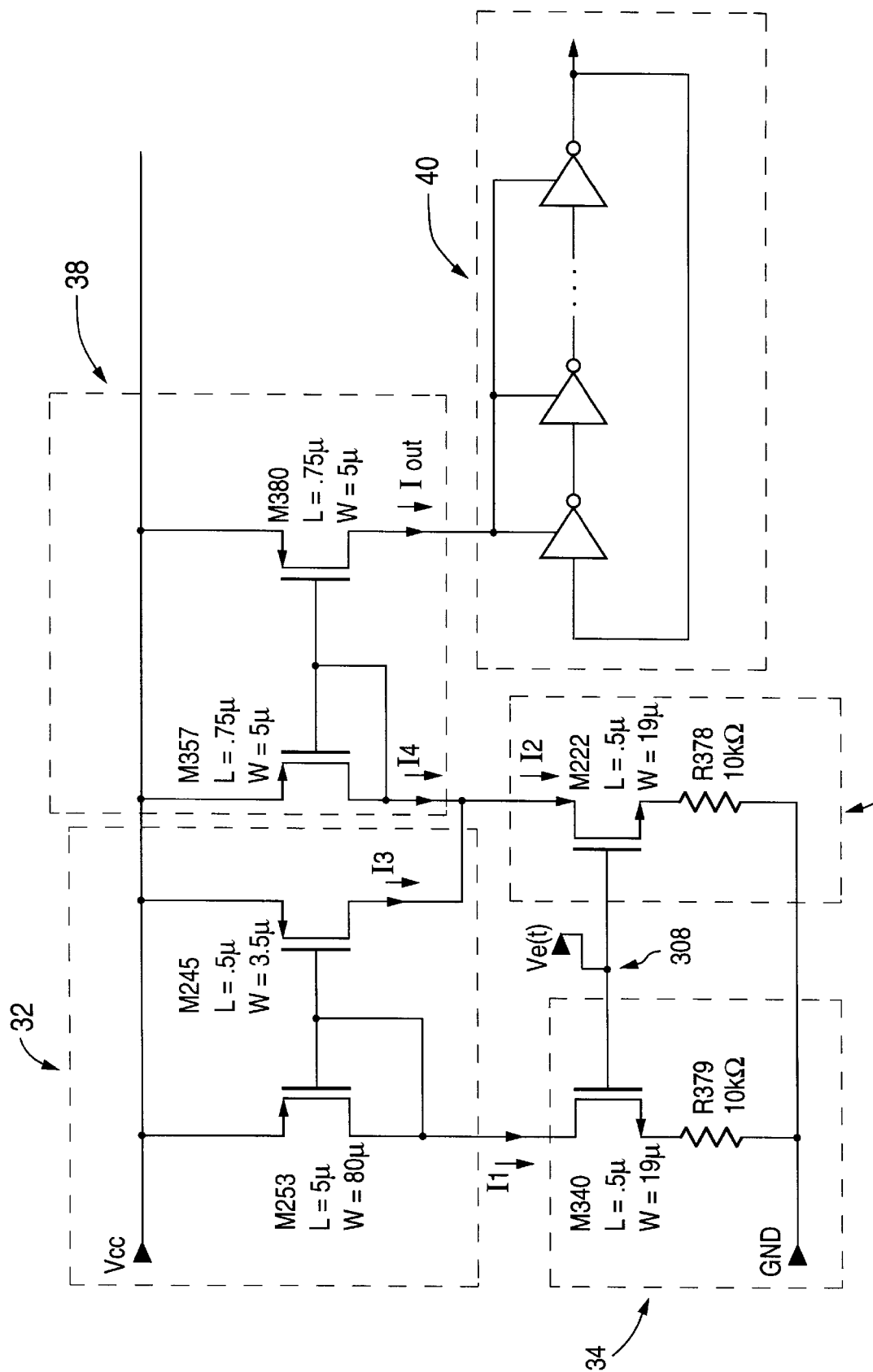
FIG. 3 is a detailed circuit diagram of a preferred embodiment of the present invention.

Referring to FIG. 3, there is shown a preferred embodiment of a VCO that employs a "variable-ratio current mirror" (32), a first reference current source (34), a second reference current source (36), an output current mirror (38), and a multistage ring oscillator (40) that includes a plurality of series-connected current-controlled inverter stages. PMOS devices M253 & M245 form the "variable-ratio current mirror"; NMOS device M340 and resistor R379 form the first reference current source; NMOS device M222 and resistor R378 form the second reference current source; and PMOS devices M357 and M380 form the output current mirror. Currents I1 & I2 of the first and second reference current sources, respectively, are established by the error voltage Ve(t). M253 has a gate channel width of W=80 microns and a gate channel length of L=5 microns; while M245 has a gate channel width of W=3.5 microns and a gate channel length of L=0.5 microns.

Figure 4:
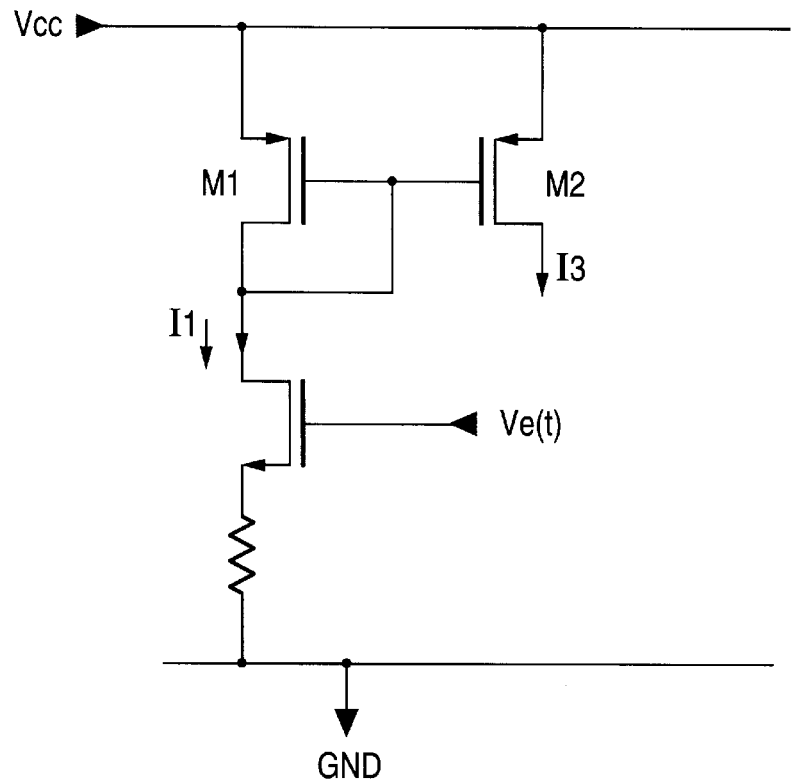
FIG. 4 is a PMOS transistor implementation of a preferred embodiment of the "variable-ratio current mirror."
Figure 5:
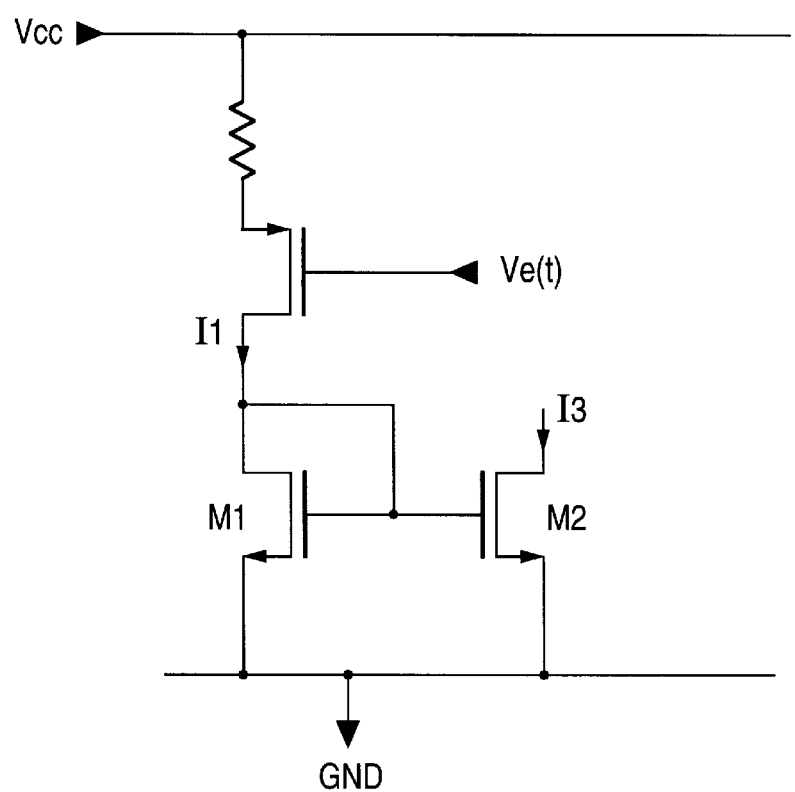
FIG. 5 is a NMOS transistor implementation of a preferred embodiment of the "variable-ratio current mirror."

FIG. 4 shows a detailed schematic of the "variable-ratio current mirror." The object of this "variable-ratio current mirror" is to have a stronger transference of current when the process is fast (strong), and a weaker transference of current when the process is slow (weak). This is accomplished by using a long gate channel for the reference PMOS transistor (M1) of the mirror and a short gate channel for the mirrored transistor (M2). For a given CMOS process, the channel strength tends to track the effective gate channel length of the devices.

The current transfer ratio, to a first order, is given by:

$$I3/I1 = W2*L1/W1*L2 \quad \text{(equation 1)}$$

where

W1=gate channel width of M1
L1=gate channel length of M1
W2=gate channel width of M2
L2=gate channel length of M2

Assume that W1 and W2 are large enough that their ratio is not significantly affected by process. Typically, W1 and W2 are set at least three times the minimum design rule geometry. Also assume that the change in the effective channel length of the transistor gates is constant for short and long channels. As depicted in FIG. 3, if L1 is set to ten times the minimum design rule and L2 is set to the minimum design rule geometry, then the ratio L1/L2 is greater when the process is fast (channel length decreases) than when the process is slow (channel length increases) since the changes in the effective channel length of both devices are the same. The result is more current is being subtracted away from the control current under fast conditions and less for slow conditions.

Referring to FIG. 3, if the input current to the "variable-ratio current mirror" is the same or less than the master control current (I1<=I2) and the ratio I3/I1 (n) is not allowed to exceed one, the tuning characteristic for the VCO will not enter the condition where the process compensation current is too high. This situation is represented by the following equations:

I1=I2; 0<n<1

Strong process: n increases towards 1
Weak process: n decreases towards 0

$$Iout = I2 - nI1 = I1 - nI1 = I1(1-n) \quad \text{(equation 2)}$$

Referring to equation 1, I3/I1=(3.5*5)/(80*0.5)=0.44=n

Referring to equation 2, $$Iout = I2 - nI1 = I1 * (1 - n) = I1 * (1 - .4375) = 0.56\, I1$$

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

I claim:

1. A current controlled oscillator circuit comprising:

a first current mirror, for providing a variable output current that varies in response to process, having a reference MOS transistor and a mirrored MOS transistor, wherein said mirrored MOS transistor having a predetermined channel length and said reference MOS transistor having a greater predetermined channel length than the channel length of said mirrored MOS transistor;

a second current mirror coupled to said first current mirror to provide a control current that decreases in response to an increase in the variable output current of said first current mirror, wherein said second current mirror having a reference MOS transistor and a mirrored MOS transistor; and a multi-stage ring oscillator having a plurality of series-connected inverter stages, wherein said multi-stage ring oscillator is responsive to the control current of said second current mirror for controlling the frequency of oscillation of said multi-stage ring oscillator.

2. A current controlled oscillator circuit as recited in claim 1, further comprising:

a first reference current source to provide a first reference current flowing through said reference MOS transistor of said first current mirror; and a second reference current source to provide a second reference current, wherein current flowing through said reference MOS transistor of said second current mirror is established as the difference between the second reference current and the variable output current of said first current mirror.

3. A current controlled oscillator circuit as recited in claim 2, further comprising:

a tuning voltage, coupled to said first and second reference current sources, wherein said first and second current sources are responsive to said tuning voltage for establishing the reference currents of said first and second reference current sources.

4. A current controlled oscillator circuit as recited in claim 3, wherein:

the predetermined channel length of the reference MOS transistor of said first current mirror is at least three times greater than the predetermined channel length of the mirrored MOS transistor of said first current mirror.

5. A current controlled oscillator circuit as recited in claim 3, wherein:

the reference and mirrored MOS transistors of said first and second current mirrors are PMOS transistors.

6. A current controlled oscillator circuit as recited in claim 3, wherein:

the reference and mirrored MOS transistors of said first and second current mirrors are NMOS transistors.

7. A current controlled oscillator circuit comprising:

a first, a second, a third, and a fourth PMOS transistor, wherein each said PMOS transistors having a drain terminal, a gate terminal, and a source terminal, and wherein, the source terminals of each said first, second, third, and fourth PMOS transistors are connected to a supply voltage, and wherein the gate terminal of said third and fourth PMOS transistors are connected to the drain terminal of said third PMOS transistor, and wherein the drain terminal of said fourth PMOS transistor outputs a control current, and even further wherein said first PMOS transistor having a channel length at least three times greater than said second PMOS transistor's channel length;

a first, and a second NMOS transistor, wherein each said NMOS transistor having a drain terminal, a gate terminal, and a source terminal, and further wherein, the drain terminal of said first NMOS transistor is connected to the gate and to the drain terminals of said first PMOS transistor, the gate terminal of said first NMOS transistor is connected to the gate terminal of said second NMOS transistor, and wherein the drain terminal of said second NMOS transistor is connected to the drain terminals of said second and third PMOS transistors;

a first resistor having a first terminal and a second terminal, wherein the first terminal is connected to the source terminal of said first NMOS transistor, and the second terminal is connected to ground;

a second resistor having a first terminal and a second terminal, wherein the first terminal is connected to the source terminal of said second NMOS transistor, and the second terminal is connected to ground;

a tuning voltage connected to the gate terminal of said first and second NMOS transistors, wherein a first reference current flowing through said first NMOS transistor and a second reference current flowing through said second NMOS transistor is established, and further wherein said first and second reference currents are responsive to said tuning voltage; and a multi-stage ring oscillator having a plurality of series-connected inverter stages, wherein said multi-stage ring oscillator is coupled to and responsive to the control current of the drain terminal of said fourth PMOS transistor for controlling the frequency of oscillation of said multi-stage ring oscillator.

8. A method of generating an oscillating clock signal, the method comprising the steps of:

receiving an input tuning voltage;

generating a variable current that varies in response to process;

generating a reference current responsive to said input tuning voltage;

subtracting said variable current from said reference current to produce a control current; and providing said control current to a current-controlled multistage ring oscillator to generate an oscillating clock signal.

* * * * *